United States Patent [19]

Bernardi

[11] Patent Number: 4,872,943
[45] Date of Patent: Oct. 10, 1989

[54] PROCESS FOR MAKING MONOCRYSTALLINE HGCDTE LAYERS

[75] Inventor: Sergio Bernardi, Turin, Italy

[73] Assignee: Selenia Industrie Elettroniche Associate S.p.A., Bacoli, Italy

[21] Appl. No.: 207,259

[22] Filed: Jun. 15, 1988

[30] Foreign Application Priority Data

Jun. 16, 1987 [IT] Italy .................. 67519 A/87

[51] Int. Cl.$^4$ .............. C30B 19/04; C30B 19/06; C30B 19/10
[52] U.S. Cl. .................. 156/621; 156/601; 156/622; 156/624; 156/DIG. 72; 156/DIG. 52; 156/DIG. 90; 148/DIG. 101
[58] Field of Search .......... 156/601, 621, 622, 624, 156/DIG. 72, DIG. 82, DIG. 90; 148/DIG. 101

[56] References Cited

U.S. PATENT DOCUMENTS

| | | | |
|---|---|---|---|
| 3,725,135 | 4/1973 | Hager et al. | 156/DIG. 72 |
| 3,902,924 | 9/1975 | Macidek et al. | 156/621 |
| 4,315,477 | 2/1982 | Wang et al. | 156/624 |
| 4,317,689 | 3/1982 | Bowers et al. | 156/DIG. 82 |
| 4,344,476 | 8/1982 | Sutcliffe et al. | 156/624 |
| 4,642,142 | 2/1987 | Harman | 156/DIG. 72 |

FOREIGN PATENT DOCUMENTS 57-211725 12/1982 Japan ................. 156/621

OTHER PUBLICATIONS

Willardson et al., "Semiconductors and Semimetals", vol. 18, Mercury Cadmium Telluride, Academic Press, New York, 1981, pp. 88 to 91.

Primary Examiner—John Doll
Assistant Examiner—Robert M. Kunemund
Attorney, Agent, or Firm—Herbert Dubno

[57] ABSTRACT

A process for making single-crystal mercury cadmium telluride layers by epitaxial growth on a cadmium telluride substrate, performed inside a reactor with two communication zones, kept at different and controlled temperatures. The growth solution is directly prepared inside the reactor by subjecting weighed cadmium and tellurium quantities and a mercury bath to a specific thermal cycle so that the mercury concentration in the solution is established by absorption from the vapor phase and is controlled by the lower temperature level.

1 Claim, 1 Drawing Sheet

PROCESS FOR MAKING MONOCRYSTALLINE HGCDTE LAYERS

FIELD OF THE INVENTION

My present invention relates to an industrial process for preparing semiconductor materials for optoelectronic devices and, more particularly, to a process for making single-crystal mercury cadmium telluride layers, also identified as HgCdTe layers herein.

BACKGROUND OF THE INVENTION

Monocrystalline HgCdTe is considered highly suitable for the fabrication of optoelectronic devices operating at high wavelengths (2–40 μm). More particularly, because of the low energy gap between valence and conduction bands, it is suitable for the fabrication of photodetectors for infrared radiation with wavelengths ranging between 8 and 14 μm, when the HgCdTe material contains about 10% by weight of cadmium.

In fact, the energy necessary to produce electron-hole pairs in the semiconductor is only about 0.1 eV for the cited composition.

Optoelectronic devices can thus be fabricated for detecting low-energy radiations, such as, for instance, those emitted by an object at room temperature.

Monodimensional or bidimensional arrays, forming the photosensitive elements of high-performance imaging systems, can be obtained with devices of this kind. Such systems can supply thermal images useful in various applications, by instance illness diagnosis, terrestrial pollution mapping from on board satellites, sighting of objects or people under poor visibility conditions, etc.

As is known high-performance electronic devices can be fabricated using a basic semiconductor material in the form of a single crystal. In fact only in the case of monocrystal does the material possess physical properties which are constant and well defined at every point of its volume. That is why the performances of the devices obtained with such materials may be optimized.

In addition, the single crystal used must have a lattice periodicity which is as perfect as possible in order to avoid undesired reductions in the efficiency of photodetection on the quantum level.

The desired characteristics of such materials can best be obtained by epitaxial growth techniques, which also allow the formation of the broad surfaces necessary to the fabrication of photodetector arrays. Liquid and vapor phase epitaxial growth techniques are well known. The former are the most-widely used at the present time.

Liquid-phase epitaxial growth consists of the deposition on a single-crystal substrate of alloys with compositions depending on those of suitable growth solutions. Starting from solutions where melted tellurium acts as solvent and cadmium and mercury are the solutes, single-crystal layers of the ternary mercury cadmium telluride compound can be deposited on the binary cadmium telluride compound, generally used as substrate. The deposition takes palce by bringing the substrate into contact with the slightly supersaturated solution.

The growth solution has been prepared heretofore in a process and location different from that at which epitaxial growth takes place. The preparation method usually involved sealing in a quartz ampoule convenient quantities of tellurium, cadmium and mercury, homogenizing them at a temperature higher than 500° C. for some tens of hours, and of rapidly quenching them to preserve the homogeneous composition of the liquid. Parts of this alloy were then used as the growth solutions in subsequent cycles of epitaxial deposition of a single-crystal substrate.

Unluckily, all techniques used in growing cadmium mercury mixed tellurides are highly complicated by the strong tendency of mercury to evaporate.

This tendency to evaporate is favored by the need to operate the growth process at temperatures higher than the melt temperature of solvent tellurium, which is about 500° C.

Mercury evaporation causes variations during growth thermal cycles both in the single-crystal solid, and in the solution it is generated by (for liquid-phase techniques).

To overcome this disadvantage, different methods have been suggested to protect the solution composition. A method described in Semiconductors and Semimetals, Academic Press, Vol. 18, 1981, pages 70–84, proposes insertion in a sealed ampoule of both the solution and the substrate, on which the deposition is effected by bringing into contact the solution and solid.

In practice this method has been abandoned owing to the difficulties encountered in controlling growth phases inside the closed ampoule and the impossibility of implementing structures with different composition layers.

According to another method, described by T.C. Harman in papers published in Journal of Electronic Materials, Vol. 9, No. 6, pages 945–961 and Vol. 10, No. 6, pages 1069–1085, the solution and substrate are placed into a reactor with a hydrogen atmosphere at atmospheric pressure and the solution composition is preserved by means of a mercury source inside the reactor itself. The source consists of a mercury bath maintained at a lower temperature than that of the growth solution, but such as to produce a partial mercury vapor pressure equal to that of the solution equilibrium. That is obtained by placing the reactor into a furnace with two zones at different temperatures. This method, according to the literature, requires the solution to be prepared in a phase preceding the growth phase. Preparing the solution in a sealed ampoule can be disadvantageous due to possible contamination of the solution during handling and because the process is lengthened and thus industrially less interesting.

OBJECTS OF THE INVENTION

It is an object of the invention to provide an improved process for the fabrication of single-crystal mercury cadmium telluride layers, provided by the present invention, which permits implementing in a single phase both the preparation of the growth solution and the epitaxial growth, thus completely avoiding the need for separate operations of preparing an ampoule, which are long and detrimental to material purity.

Another object is to provide a process for the purposes described which allow fabrication of multilayer structures utilizing different-composition growth solutions.

SUMMARY OF THE INVENTION

The present invention provides a process for fabricating monocrystalline mercury cadmium telluride layers by epitaxial growth on a cadmium telluride substrate inside a reactor with two communicating zones maintained at different and controlled temperatures. According to the invention:

weighed amounts of cadmium and tellurium are placed in a well inside the reactor in the higher-temperature zone and are melted and homongenized, so as to obtain a solution of cadmium in tellurium;

a mercury bath is placed inside the reactor in the lower-temperature zone and is heated so as to obtain a mercury vapor atmosphere in the entire reactor;

due to the absorption of vapor state mercury, the solution of cadmium in tellurium is converted into a solution of cadmium and mercury in tellurium and homogenized as an effect of thermal agitation at the higher temperature; the solution and mercury bath are slowly cooled down so as to produce the solution supersaturation and keep its composition constant; and the substrate is brought into contact with the solution and the epitaxial growth of single-crystal mercury cadmium telluride is carried out.

Preferably the control of the lower temperature of the mercury bath is used to control the proportion of Hg in the solution.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
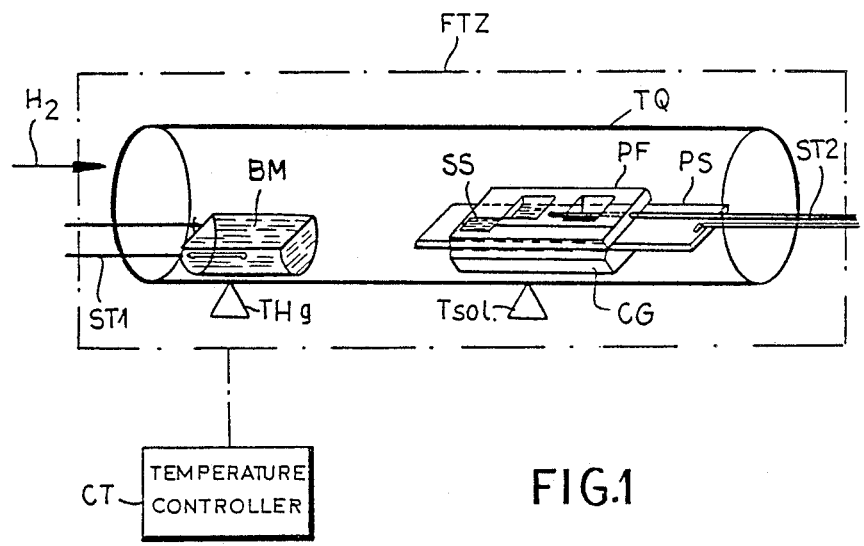
FIG. 1 is a schematic perspective view of a reactor for epitaxial growth.

The reactor, schematically represented in FIG. 1, consists of a quartz tube TQ, through which a high-purity hydrogen flow ($H_2$) is maintained under atmospheric pressure, in order to avoid oxidative phenomena.

On the left there is a mercury bath BM, maintained at temperature THg as shown symbolically, and on the right the growth crucible CG. The latter comprises a slider PS, housing a cadmium telluride substrate SS, and a fixed part PF containing two wells for growth solutions, kept at temperature Tsol.

During the process different-composition solutions can be produced in both wells, whenever different composition layers are desired, or a single solution can be formed in one of the two wells.

ST1 and ST2 denote two temperature probes, permitting an accurate measurement of the mercury bath and of the growth solution temperatures. Moreover, a two-zone furnace FTZ, represented only diagrammatically in FIG. 1, surrounds the quartz tube so as to maintain the mercury bath and solution at the temperature THg and Tsol.

After attaining optimal growth conditions, the solution composed of tellurium, cadmium and mercury in the desired percentages is brought into contact with the substrate by moving crucible slider PS and is kept in this position for the time necessary to deposit the desired thickness of mercury cadmium telluride.

The invention deals with the process part which precedes the epitaxial growth and particularly concerns the way of generating the desired growth solution starting from a solution of cadmium in tellurium and a mercury bath, following a particular thermal cycle under suitable conditions.

A well of the growth crucible is filled with weighed amounts of cadmium and tellurium and substrate SS is placed on the slider PS. The composition of the two-component solution is determined according to known methods (see e.g. the previously cited papers by T.G. Harman) as a function of the composition of desired solid layers.

The growth crucible without the mercury bath is introduced into the quartz tube raised to operative thermal conditions by the two-zone furnace. The crucible is then at a temperature of about 500° C. at which cadmium and tellurium melt, hence, after an interval of about an hour, a perfect homogenization of the solution is achieved as an effect of thermal agitation.

Now, the mercury bath is introduced into the quartz tube and its temperature is progressively raised to the value THg of the left part of the furnace. As a consequence a mercury vapor atmosphere is created with a mercury partial pressure determined by the temperature, which is generally about 230° C. Hence the long absorption phase of the mercury by the initial solution of cadmium in tellurium can start.

The solution progressively becomes a cadmium and mercury solution in tellurium. At the same time with the formation phase, there is a further homogenization of the solution induced by the thermal activation.

Partial mercury pressure of the solution is exactly equal to mercury bath pressure at temperature THg. Hence, by controlling temperature THg by the two-zone furnace using the temperature controller CT, the mercury concentration in growth solution is controlled. The mercury concentration, as well as the concentration of previously weighed cadmium, determines the composition of solid single-crystal layers on the substrate.

The substrate is then brought into contact, as already described, with the solution in a slight-supersaturation condition of the latter, and is left in position for some tens of minutes, so as to obtain the desired thickness of deposited solid.

Figure 2:
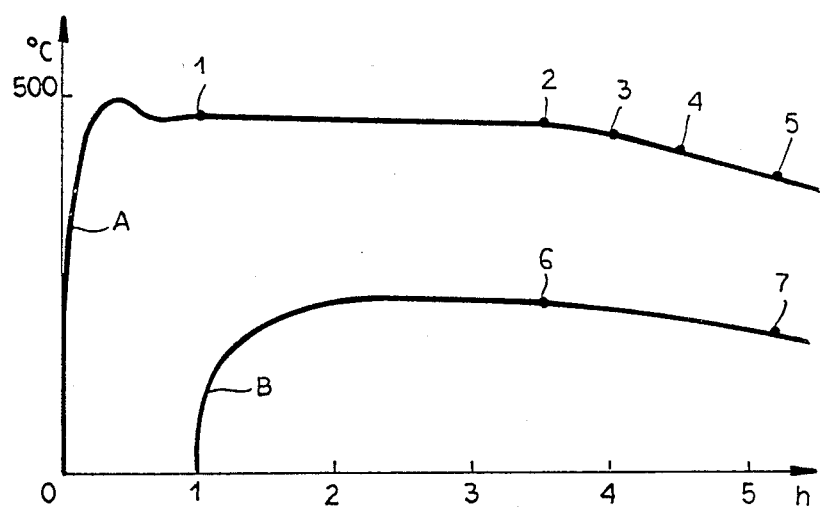
FIG. 2 is a time diagram representing temperature profiles of the baths contained in the reactor.

The temperature profiles in the solution and in the mercury bath versus time are plotted on Cartesian diagram of FIG. 2 and are respectively denoted by A and B.

The part of curve A which goes from origin to point 1, of the duration of about one hour, corresponds to the homogenization period of the solution of cadmium in tellurium.

Between points 1 and 2, for the duration of about two hours and a half, there is formation and homogenization of the solution of cadmium and mercury in tellurium, hence, with a temperature decrease of 2 to 3° C. for half an hour, one reaches point 3, where the solution can be found in the supersaturation condition. Then the epitaxial growth can start. The growth actually begins at point 4 and ends at point 5.

Curve B, relevant to mercury bath temperature, starts from room temperature an hour after growth solution heating has started and reaches the temperature necessary to generate the desired partial pressure of mercury vapor. The solution is formed in correspondence with point 6 and only its composition must be preserved during epitaxial growth on the substrate. To this end the mercury bath can be subjected to controlled cooling of some tenths of a degree per minute, comprised between points 6 and 7. Yet, to avoid variations in the solution composition, the ratio among time derivatives of the temperatures must be equal to the ratio between partial differentials of the vapor pressures with temperature for the corresponding vapor pressures.

Operative conditions and the results reached during a typical growth process of single-crystal mercury cadmium telluride layers are now described.

SPECIFIC EXAMPLES

To obtain layers with 39% by weight mercury, 11% by weight cadmium and 50% by weight tellurium, in the crucible well a solution is generated composed of a mole fraction of mercury equal to 0.155 and a mole fraction of cadmium equal to 0.0075, balance tellurium.

The homogenization of the solution can be advantageously performed at a temperature of a few degrees higher than the equilibrium temperature Tsol, equal to 472.5° C., while at a 2 or 3-degree lower temperature supersaturation condition allowing growth to start is obtained. Mercury bath temperature THg during the formation phase is about 234° C. and during the growth phase decreases by 0.2° C./min, with a ratio among gradients equal to about 1.2.

Thus single-crystal layers of a thickness ranging from 20 to 40 μm and of good morphology are obtained on a 3 cm² substrate, using 0.08-mole solution. The mercury weight incorporated by such a solution during its formation and homogenization phase is 2.487 g.

In case different-composition single-crystal layers are desired, different composition solutions are formed in the two crucible wells starting from different contents of weighed cadmium, and the substrate is brought into contact with either one or the other cmposition alternately for the time necessary to the deposition of solid thickness desired.

I claim:

1. A process for fabricating single-crystal mercury cadmium telluride layers by epitaxial growth on a cadmium telluride substrate, performed inside a reactor with two communicating zones maintained at different and controlled temperatures, said method comprising the steps of:
    (a) placing weighed quantities of cadmium and tellurium in a well inside the reactor in a higher-temperature zone, melting the cadmium and tellurium and homogenizing same, so as to produce a solution of cadmium in tellurium;
    (b) disposing a mercury bath inside the reactor in a lower-temperature zone and heating said bath so as to obtain a mercury vapor atmosphere through said reactor;
    (c) by the absorption of vapor state mercury, converting the solution of step (a) into a solution of cadmium and mercury in tellurium and homogenizing the converted solution by thermal agitation at the higher temperature;
    (d) cooling the solution formed in step (c) and the mercury bath slowly so as to produce supersaturation of the solution of cadmium and mercury in tellurium and keeping its composition constant;
    (e) contacting a cadmium telluride substrate with the supersaturated solution of step (d) and effecting epitaxial growth of single-crystal mercury cadmium telluride on said substrate from said supersaturated solution; and
    (f) controlling the composition of said solution of cadmium and mercury in tellurium by regulating the lower temperature of the mercury bath, the composition of said supersaturated solution being maintained constant all during epitaxial growth by contemporarily reducing the solution and mercury bath temperatures, but maintaining the reaction between time derivatives of said temperatures equal to the ratio between respective partial derivatives of the partial pressures with temperature.

* * * * *